US009484186B2

(12) United States Patent
Song et al.

(10) Patent No.: US 9,484,186 B2
(45) Date of Patent: Nov. 1, 2016

(54) MODELING AND CORRECTING SHORT-RANGE AND LONG-RANGE EFFECTS IN E-BEAM LITHOGRAPHY

(71) Applicant: Synopsys, Inc., Mountain View, CA (US)

(72) Inventors: Hua Song, San Jose, CA (US); Irene Y. Su, Chu-Pei (TW); James P. Shiely, Aloha, OR (US)

(73) Assignee: SYNOPSYS, INC., Mountain View, CA (US)

( * ) Notice: Subject to any disclaimer, the term of this patent is extended or adjusted under 35 U.S.C. 154(b) by 713 days.

(21) Appl. No.: 13/658,630

(22) Filed: Oct. 23, 2012

(65) Prior Publication Data
US 2014/0114634 A1 Apr. 24, 2014

(51) Int. Cl.
*G06F 7/60* (2006.01)
*H01J 37/317* (2006.01)
*G03F 1/70* (2012.01)

(52) U.S. Cl.
CPC ............ *H01J 37/3174* (2013.01); *G03F 1/70* (2013.01); *H01J 2237/31769* (2013.01); *H01J 2237/31788* (2013.01); *H01J 2237/31794* (2013.01)

(58) Field of Classification Search
CPC .......................... G06F 17/50; G06F 17/5081
USPC .......................................................... 703/2
See application file for complete search history.

(56) References Cited

U.S. PATENT DOCUMENTS

| 5,051,598 | A | * | 9/1991 | Ashton et al. ............. 250/492.2 |
| 5,241,185 | A | * | 8/1993 | Meiri et al. ................ 250/492.2 |
| 5,432,714 | A | * | 7/1995 | Chung ................. H01J 37/3026 250/492.2 |
| 5,736,281 | A | * | 4/1998 | Watson .................. B82Y 10/00 430/296 |
| 5,847,959 | A | * | 12/1998 | Veneklasen et al. ......... 700/121 |
| 8,468,473 | B1 | * | 6/2013 | Wang et al. .................... 716/55 |
| 2002/0182521 | A1 | * | 12/2002 | Fujisawa et al. ............... 430/22 |
| 2004/0205688 | A1 | * | 10/2004 | Pierrat ............................ 716/21 |
| 2004/0265713 | A1 | * | 12/2004 | Shiobara ............. G03F 7/70608 430/30 |
| 2005/0273753 | A1 | * | 12/2005 | Sezginer ........................ 716/21 |
| 2005/0287450 | A1 | * | 12/2005 | Hudek et al. ................... 430/30 |

(Continued)

OTHER PUBLICATIONS

Liu et al. ("Model-Based Proximity Effect Correction for Electron-Beam—Direct-Write Lithography", Proc. of SPIE vol. 7637 76371V-1, 2010, pp. 1-8).*

(Continued)

*Primary Examiner* — Omar Fernandez Rivas
*Assistant Examiner* — Iftekhar Khan
(74) *Attorney, Agent, or Firm* — Park, Vaughan, Fleming & Dowler LLP; Laxman Sahasrabuddhe

(57) ABSTRACT

Processes and apparatuses are described for modeling and correcting electron-beam (e-beam) proximity effects during e-beam lithography. An uncalibrated e-beam model, which includes a long-range component and a short-range component, can be calibrated based on one or more test layouts. During correction, a first resist intensity map can be computed based on the long-range component of the calibrated e-beam model and a mask layout. Next, a target pattern in the mask layout can be corrected by, iteratively: (1) computing a second resist intensity map based on the short-range component of the calibrated e-beam model and the target pattern; (2) obtaining a combined resist intensity map by combining the first resist intensity map and the second resist intensity map; and (3) adjusting the target pattern based on the combined resist intensity map and the design intent.

24 Claims, 8 Drawing Sheets

A HYBRID APPROACH FOR E-BEAM EFFECT CORRECTION

(56) References Cited

U.S. PATENT DOCUMENTS

| | | |
|---|---|---|
| 2007/0114453 A1* | 5/2007 | Emi et al. ............ 250/492.2 |
| 2008/0067446 A1* | 3/2008 | Belic et al. ............ 250/492.22 |
| 2008/0203324 A1* | 8/2008 | Fujimura et al. ........ 250/492.23 |
| 2012/0221980 A1* | 8/2012 | Fujimura ............ G03F 7/2061 716/53 |
| 2013/0275925 A1* | 10/2013 | Wang et al. ............ 716/53 |

OTHER PUBLICATIONS

Liu et al. ("A novel curve-fitting procedure for determining proximity effect parameters in electron beam lithography", Proc. of SPIE vol. 7140 714011-1, 2008, pp. 1-10).*

T. H. P. Chang ("Proximity effect in electron-beam lithography", J. Vac. Sci. Technol., vol. 12, No. 6, Nov./Dec. 1975, pp. 1271-1275).*

Liming Ren ("Proximity Effect in Electron Beam Lithography", IEEE, 2004, pp. 579-582).*

* cited by examiner

MODELING AND CORRECTING SHORT-RANGE AND LONG-RANGE EFFECTS IN E-BEAM LITHOGRAPHY

BACKGROUND

1. Technical Field

The present disclosure generally relates to electronic design automation. More specifically, the present disclosure relates to modeling electron-beam (e-beam) proximity effects during e-beam lithography, and correcting a mask layout to compensate for the e-beam proximity effects.

2. Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

Conventional photolithography processes are close to reaching their physical limit in terms of the minimum feature size that can be printed with these technologies. Hence, the semiconductor industry is actively considering various next-generation photolithography technologies which will enable feature sizes to be miniaturized even further. One of the more promising technologies is electron-beam (e-beam) lithography. It has emerged as one of the leading technologies for manufacturing devices directly on wafer (i.e., e-beam direct write) when the critical dimensions shrink to below 20 nm and mask cost becomes prohibitively high. In both cases, patterning fidelity is compromised by some undesirable electron effects, such as beam blurring, primary electron forward scattering and backscattering, secondary electron scattering, fogging, and resist heating and charging, among others.

Process models are commonly used to model semiconductor manufacturing processes. A process model can be used in a number of applications during the design of a semiconductor chip. For example, process models are commonly used for making corrections to layouts to compensate for undesirable effects of semiconductor manufacturing processes.

Inaccuracies in the process model can negatively affect the efficacy of downstream applications. For example, inaccuracies in a photolithography process model can reduce the efficacy of optical proximity correction (OPC). Hence, it is desirable to develop accurate process models for next-generation process technologies.

SUMMARY

Some embodiments described herein provide techniques and systems for modeling e-beam proximity effects using an e-beam lithography model. During operation, the system receives an uncalibrated e-beam model which includes a long-range component which models long-range electron effects, and a short-range component which models short-range electron effects, and a set of model parameters to be calibrated. The system also receives a test pattern for calibrating the e-beam model. Next, the system pre-computes a first intensity (the resist intensity indicates the level of energy deposited in the resist by the electron beam) map based at least on the long-range component of the e-beam model and the test layout. The system subsequently calibrates the e-beam model by, iteratively: (1) computing a second intensity map based at least on the short-range component of the e-beam model and the test pattern; (2) obtaining a combined resist intensity map on the target pattern by combining the first resist intensity map and the second resist intensity map; and (3) adjusting the set of model parameters associated with the e-beam model based at least on the combined intensity map and the test pattern.

In some embodiments, the system adjusts the set of model parameters associated with the e-beam model by first applying a resist intensity threshold on the combined resist intensity map to obtain one or more simulated critical dimensions (CDs). The system subsequently optimizes the set of model parameters to minimize the differences between the simulated CDs and corresponding measured CDs obtained from the fabricated test pattern on a wafer.

Some embodiments described herein provide techniques and systems for correcting a mask layout to compensate for electron-beam (e-beam) proximity effects during e-beam lithography. During operation, the system receives a calibrated e-beam model which includes a long-range component which models long-range electron effects, and a short-range component which models short-range electron effects. The system also receives a mask layout to be corrected, wherein the mask layout is generated based on a design intent. Next, the system pre-computes a first resist intensity map based at least on the long-range component of the e-beam model and the mask layout. The system subsequently corrects a target pattern within the mask layout by, iteratively: (1) computing a second resist intensity map on the target pattern based at least on the short-range component of the e-beam model and the target pattern; (2) obtaining a combined resist intensity map on the target pattern by combining the first resist intensity map and the second resist intensity map; and (3) adjusting the target pattern based at least on the combined resist intensity map and the design intent.

In some embodiments, the system pre-computes the first resist intensity map by receiving a grid map for the mask layout. The system then creates a dose distribution function over the grid map based on the mask layout. Next, the system convolves the long-range component of the e-beam model with the dose distribution function over the grid map to obtain the first resist intensity map.

In some embodiments, the system creates the dose distribution function over the grid map by assigning a dose value at a given grid point on the grid map based at least on a local feature density associated with the mask layout at the grid point.

In some embodiments, the system stores the first resist intensity map in a lookup table.

In some embodiments, the system obtains the combined resist intensity map on the target pattern by retrieving, from the lookup table, one or more values of the first resist intensity map within a portion of the grid map that covers the target pattern. The system then combines the one or more values of the first resist intensity map with the second resist intensity map.

In some embodiments, the system computes the second resist intensity map by first creating a local dose distribution function on a local grid map associated with the target pattern. The system then convolves the short-range component of the e-beam model with the local dose distribution function to obtain the second resist intensity map for the target patterns.

In some embodiments, the system adjusts the target pattern by first applying a resist intensity threshold to the combined resist intensity map to obtain a simulated resist pattern edge position. The system then compares the simulated resist pattern edge position with the design intent for the target pattern to determine if the simulated resist pattern edge position substantially matches the design intent. If the simulated resist pattern edge position does not match the design intent, the system adjusts the target pattern based on a difference between the simulated resist pattern edge position and the design intent.

In some embodiments, the system adjusts the target pattern by adjusting a geometric feature on the target pattern.

In some embodiments, the system corrects multiple target patterns on the mask layout.

In some embodiments, the system performs mask data preparation on the mask layout after the mask layout has been corrected for the e-beam proximity effects.

In some embodiments, the system assigns a higher weight to a subnet which is associated with a greater routing area, while assigning a lower weight to a subnet which is associated with a smaller routing area.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit Design Flow

Figure 1:
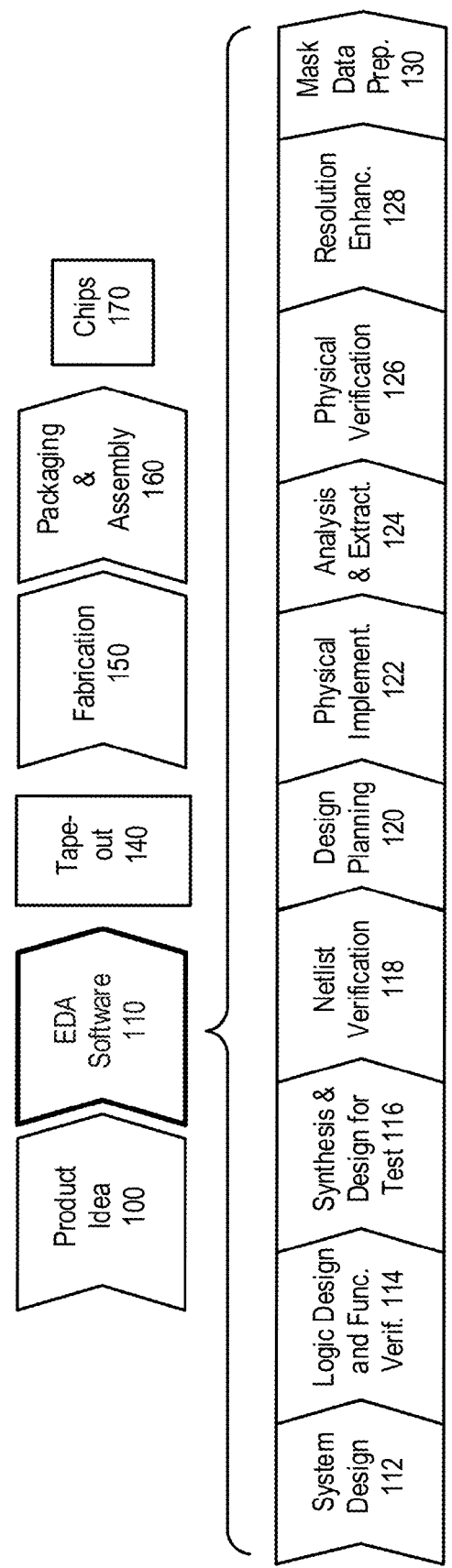
FIG. 1 illustrates various steps in the design and fabrication of an integrated circuit.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately results in finished chips (stage 170).

The EDA software design process (stage 110), in turn, comprises stage elements 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

During system design 112, the designers describe the functionality to implement. They can also perform what-if planning to refine the functionality and to check costs. Hardware-software architecture partitioning can occur at this stage. During logic design and functional verification 114, the VHDL or Verilog code for modules in the system is written and the design is checked for functional accuracy. More specifically, the design is checked to ensure that it produces the correct outputs.

During synthesis and design 116, the VHDL/Verilog is translated to a netlist. The netlist can be optimized for the target technology. Additionally, tests can be designed and implemented to check the finished chips. During netlist verification 118, the netlist is checked for compliance with timing constraints and for correspondence with the VHDL/Verilog source code. During design planning 120, an overall floor plan for the chip is constructed and analyzed for timing and top-level routing. During physical implementation 122, the placement (positioning of circuit elements) and routing (connection of the same) occurs.

During analysis and extraction 124, the circuit function is verified at a transistor level; this, in turn, permits what-if refinement. During physical verification 126, the design is checked to ensure correctness for manufacturing, electrical issues, lithographic issues, and circuitry.

During resolution enhancement 128, geometric manipulations of the layout can be performed to improve manufacturability of the design. During mask data preparation 130, the tape-out data is generated for production of masks to produce finished chips.

Embodiments of the present invention can be used during one or more of the above-described steps.

Overview of E-Beam Modeling and Correction

Some embodiments of the present disclosure provide a technique for modeling e-beam effects in an e-beam lithography model. In this technique, test patterns can be used to calibrate e-beam model parameters. Some embodiments described in the present disclosure provide a technique for correcting a mask layout to compensate for electron-beam (e-beam) proximity effects (or "e-beam effects") during e-beam lithography. One proposed technique corrects the e-beam effects in a mask layout in the following steps. First, the e-beam effects are separated into two groups: (1) short-range effects such as beam blurring and forward scattering; and (2) long-range effects such as backscattering and fogging. Second, the long-range effects on the resist are computed from the pre-correction layout and the result is stored in a long-range effect map. The map serves as a lookup table at correction time, so that only short-range effects are computed during the mask correction time. The separation of the long-range effects from the short-range effects is desirable for correction turn-around-time (TAT) because the lookup table is not recalculated during correction iterations but stays fixed.

Mathematically, most e-beam proximity effects (or "e-beam effects" hereinafter) can be characterized by Gaussian or Gaussian-like functions, while the differences in effect ranges can be represented by the different "Sigmas" (i.e., standard deviations) of the respective Gaussian terms. The sum of the effects may be characterized by a point spread function (PSF) $f(x, y)$ in the form of a sum of these functions, for example, $$f(x, y) = \frac{1}{1 + \eta_1 + \eta_2 + \eta_3} \quad (1)$$

$$\left\{ \frac{1}{\alpha^2} \exp\left(-\frac{r^2}{\alpha^2}\right) + \frac{\eta_1}{\beta_1^2} \exp\left(-\frac{r^2}{\beta_1^2}\right) + \frac{\eta_2}{\beta_2^2} \exp\left(-\frac{r^2}{\beta_2^2}\right) + \frac{\eta_3}{\beta_3^2} \exp\left(-\frac{r^2}{\beta_3^2}\right) \right\},$$

wherein $r=\sqrt{x^2+y^2}$ and the four Gaussian terms from left to right represent beam blurring, forward scattering, backscattering, and fogging effects, respectively. Additional Gaussian terms may be included in the PSF to represent other e-beam effects. Note that point spread function (PSF) $f(x, y)$ can also be expressed as the sum of a short-range PSF $f'(x, y)$, which includes all short-range effect terms (such as beam blurring, forward scattering), and a long-range PSF $f''(x, y)$, which includes all long-range effect terms (such as backscattering, and fogging):

$$f(x,y)=f'(x,y)+f''(x,y). \quad (2)$$

During an e-beam lithography process, the resist pattern can be determined by computing an energy distribution function $e(x, y)$, which represents the energy absorbed in the resist while exposing a mask under an e-beam. The value of the energy distribution function $e(x, y)$ at a given point is also referred to as the "resist intensity" in this disclosure. Prior to computing $e(x, y)$, mask patterns are typically translated into an equivalent dose distribution $d(x, y)$ using a rule-based dose assignment. The energy distribution function $e(x, y)$ can then be expressed as:

$$e(x,y)=d(x,y) \otimes f(x,y). \quad (3)$$

The initial dose assignment $d(x, y)$ could be binary, i.e. it is a constant dose inside all patterns and zero outside polygons, or it could be non-binary and determined based on certain rules. One possible initial dose assignment is the so-called "center dose reduction" that assigns lower dose to the center of large polygons, e.g., a certain distance away from the polygon borders according to some rules, to reduce mask writing time as well as heating and charging effects inside the resist. Because the initial $d(x, y)$ obtained from the rule-based dose assignment is generally coarse and lacks precision at small feature dimensions, the e-beam effect compensation problem can be considered as adjusting $d(x, y)$'s geometrical boundaries (i.e., mask shapes), dose assignment on a certain grid, or both, such that the contour of $e(x, y)$ at a properly chosen threshold is as close to the desired mask pattern (i.e., OPC output) as possible. We also refer to this desired mask pattern as a design intent.

In some techniques, such as those used in variable shaped beam (VSB) vector writers, the short-range effects during e-beam mask exposure are typically compensated for geometrically by adjusting mask shapes (i.e., OPC type of correction), while long-range effects are commonly compensated for by adjusting incident dose distribution (i.e., modulating the exposure time for different features). More specifically, the dose distribution $d(x, y)$ is non-zero only inside the polygons in the target mask layout; the polygon shapes are adjusted to compensate for the short-range effects; and the dose distribution $d(x, y)$ is adjusted to compensate for the long-range effects.

Figure 2:
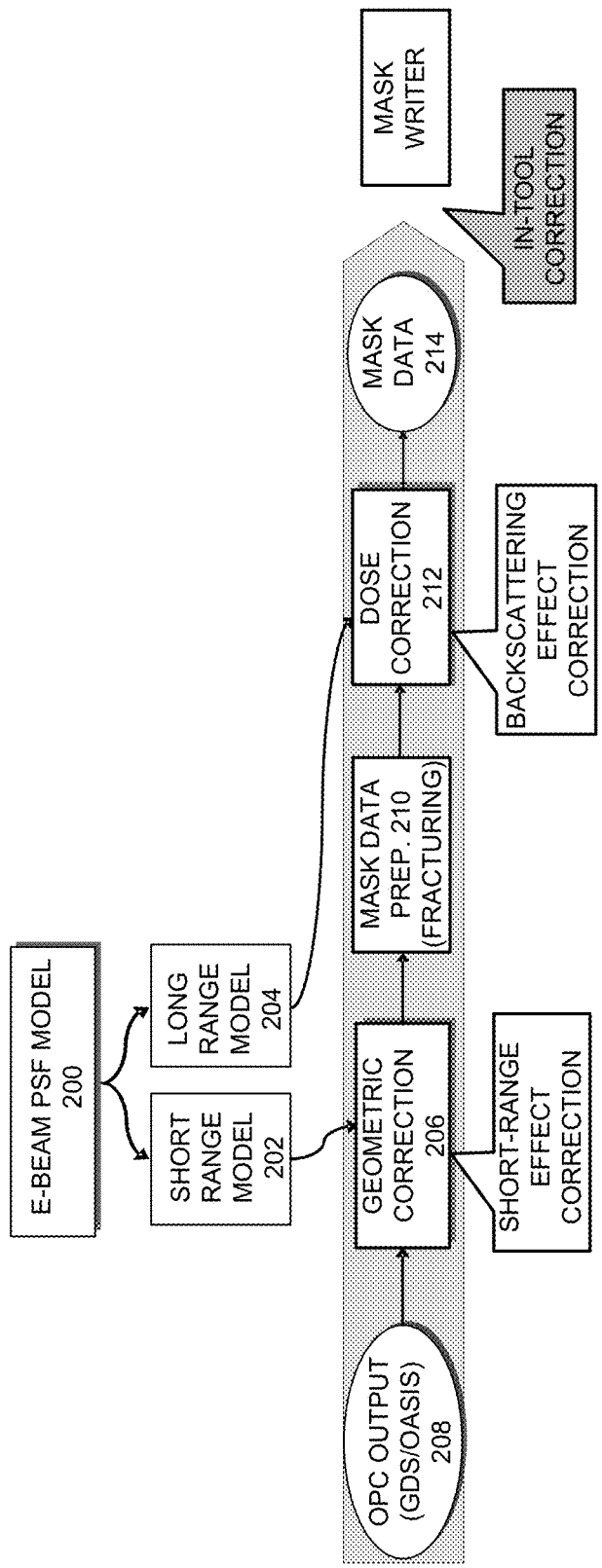
FIG. 2 illustrates a process flow of a hybrid approach for e-beam mask correction.

FIG. 2 illustrates a process flow of a hybrid approach for e-beam mask correction. As illustrated in FIG. 2, the e-beam PSF model 200 is separated into short-range model 202 and a long-range model 204. The short-range model 202 is then used for correcting short-range effects through a geometric correction 206 on an OPC output 208. The partially corrected output mask layout from geometric correction 206 is then fractured during subsequent mask data preparation 210. Next, long-range model 204 is used to correct the long-range effects through a dose correction 212 on the output of mask data preparation 210, which generates the e-beam effect-corrected mask data 214.

However, because the short-range and long-range effects are compensated for by two very different techniques at different stages of the correction process in FIG. 2, it is extremely challenging to make the two correction steps aware of each other, and to ensure that the end result provides compensation for both short and long-range effects. Moreover, the hybrid e-beam mask correction process illustrated in FIG. 2 can be inherently difficult for correction verification due to the lack of knowledge of separate correction targets for the short-range effects and the long-range effects within an overall CD error to be corrected.

While it is possible to use a pure dose modulation to correct both the short-range and the long-range effects, such an approach would require very fine dose control for compensating for short-range effects, which can significantly lengthen mask write time. Moreover, it may not even be possible to compensate for certain short-range effects with only dose modulation (e.g., asymmetric edge placement error) due to the minimum e-beam size limitation.

A pure geometric correction approach may provide a consistent way to compensate for both the short- and long-range effects at the same time. However, compensating for the long-range effects by using a technique that involves direction calculation of the long-range effects is often too slow to make it practical.

Some embodiments described below provide a geometry-based correction approach for compensating for both short-range and long-range effects during e-beam mask making or e-beam direct write. These embodiments separate the long-range effect calculation and short-range effect calculation and does the former calculation only once for best correction performance. In some embodiments, the correction process corrects both the short- and long-range effects together, which also takes place before the mask data preparation.

Process for Calibrating an E-Beam Model

Figure 3:
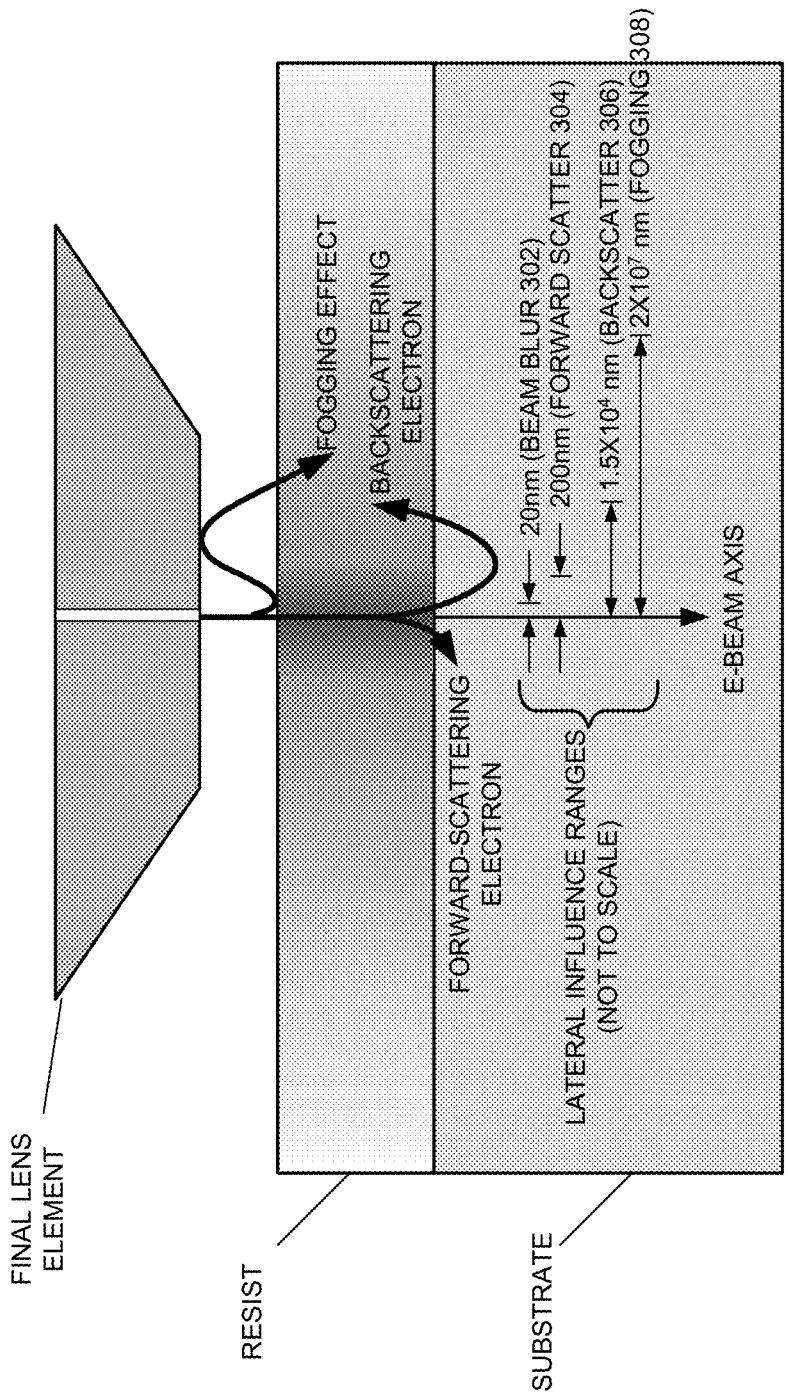
FIG. 3 illustrates different e-beam effects and the exemplary ranges in accordance with some embodiments described herein.

In some embodiments, the e-beam effects are separated into two groups: short-range effects and long-range effects. In the first group, short-range effects can include, but are not limited to, beam blurring and forward scattering. FIG. 3 illustrates different e-beam effects and the exemplary ranges in accordance with some embodiments described herein. As illustrated in FIG. 3, beam blur 302 has a range of ~20 nm, and a Sigma of ~7 nm (not shown). Forward scatter 304 has a range of ~200 nm, and a Sigma of ~70 nm (not shown). Note that for the extreme ultraviolet (EUV) mask, electron reflections from a multilayer structure (ML) typically have a range of <1.5 µm. This effect may be grouped into the short-range effects. In the second group, long-range effects can include, but are not limited to, backscattering, resist develop loading effect, and fogging. As illustrated in FIG. 3, backscatter 306 has a range of ~15 µm ($1.5\times10^4$ nm), and a Sigma of ~5 µm (not shown), while fogging 308 has a range of ~20 mm ($2\times10^7$ nm) and a Sigma of ~7 mm (not shown). As can be seen from these examples, the long-range effects work in ranges which are typically orders of magnitude greater than the short-range effects thereof.

As mentioned above, the long-range effects, due to their large effective ranges, can be extremely time-consuming if they are to be calculated iteratively. However, the long-range effects are essentially unchanged during small geometric changes made during typical edge-based corrections. In one embodiment, the long-range effects are pre-computed from a pre-correction layout and the result is stored in a long-range effect map.

Figure 4:
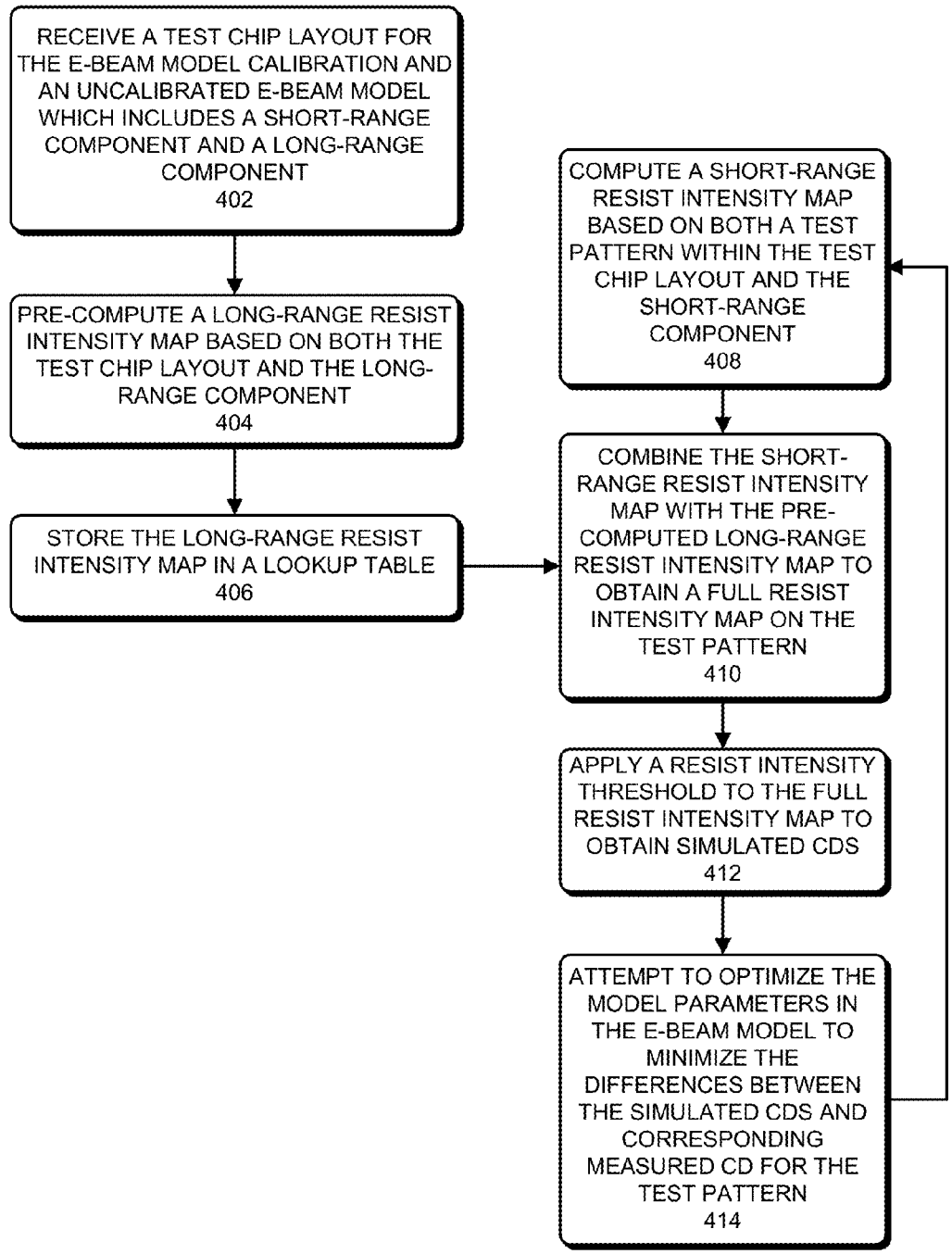
FIG. 4 presents a flowchart illustrating a process of performing an e-beam model calibration to compensate for the e-beam effects in accordance with some embodiments described herein.

FIG. 4 presents a flowchart illustrating a process of performing an e-beam model calibration to compensate for the e-beam effects in accordance with some embodiments described herein.

The process may begin by receiving a test chip layout for the e-beam model calibration and an uncalibrated e-beam model which includes a short-range component (to model the short-range effects) and a long-range component (to model the long-range effects) (step 402). Note that each of the short-range component and the long-range component of the uncalibrated e-beam model includes one or more model parameters to be regressed during the model calibration process. In one embodiment, each of the e-beam effect terms, such as beam blurring, forward scattering, backscattering, and fogging, can be associated with one or more model parameters. Note that such parameters can include a Sigma (or "standard deviation") for an effect term, an effective range of the effect term, and an associated weight.

The system then pre-computes a long-range resist intensity map based on both the test chip layout and the long-range component of the uncalibrated e-beam model (step 404). In one embodiment, the system generates a dose distribution function based on the test chip layout, and then convolves the dose distribution function with the long-range PSF corresponding to the long-range effect to obtain the long-range resist intensity map. In one embodiment, the long-range resist intensity map is computed at grid points of a coarse grid map applied over the test chip layout. Next, the system stores the long-range resist intensity map in a lookup table so that the values of the intensity map can be later retrieved and reused (step 406).

After pre-computing the long-range effects, the system begins model calibration by computing a short-range resist intensity map based on both a test pattern within the test chip layout and the short-range component of the uncalibrated e-beam model (step 408). In one embodiment, the system computes the short-range resist intensity map by convolving a short-range PSF of the short-range component of the uncalibrated e-beam model with the test pattern. In one embodiment, the short-range resist intensity map is computed at grid points of a fine grid map applied over the test pattern, wherein the grid size of the fine grid map is significantly smaller than the grid size of the coarse map associated with the long-range component of the uncalibrated e-beam model.

Next, the system combines the short-range resist intensity map with the pre-computed long-range resist intensity map to obtain a full resist intensity map on the test pattern (step 410). Note that the full resist intensity map includes both the short-range and long-range effects from the e-beam model. The system subsequently applies a resist intensity threshold to the full resist intensity map to obtain one or more simulated CDs (step 412). The system then attempts to optimize the model parameters to minimize the differences between the simulated CDs and corresponding measured CDs for the test pattern (step 414). Note that the measured CD may be separately obtained from a fabricated test pattern when the test chip is fabricated on a wafer. Also note that step 414 inherently involves a regression process. Once the model parameters have been optimized, the resulting model is referred to as a calibrated model.

Geometry-Based E-Beam Effects Correction

Figure 5A:
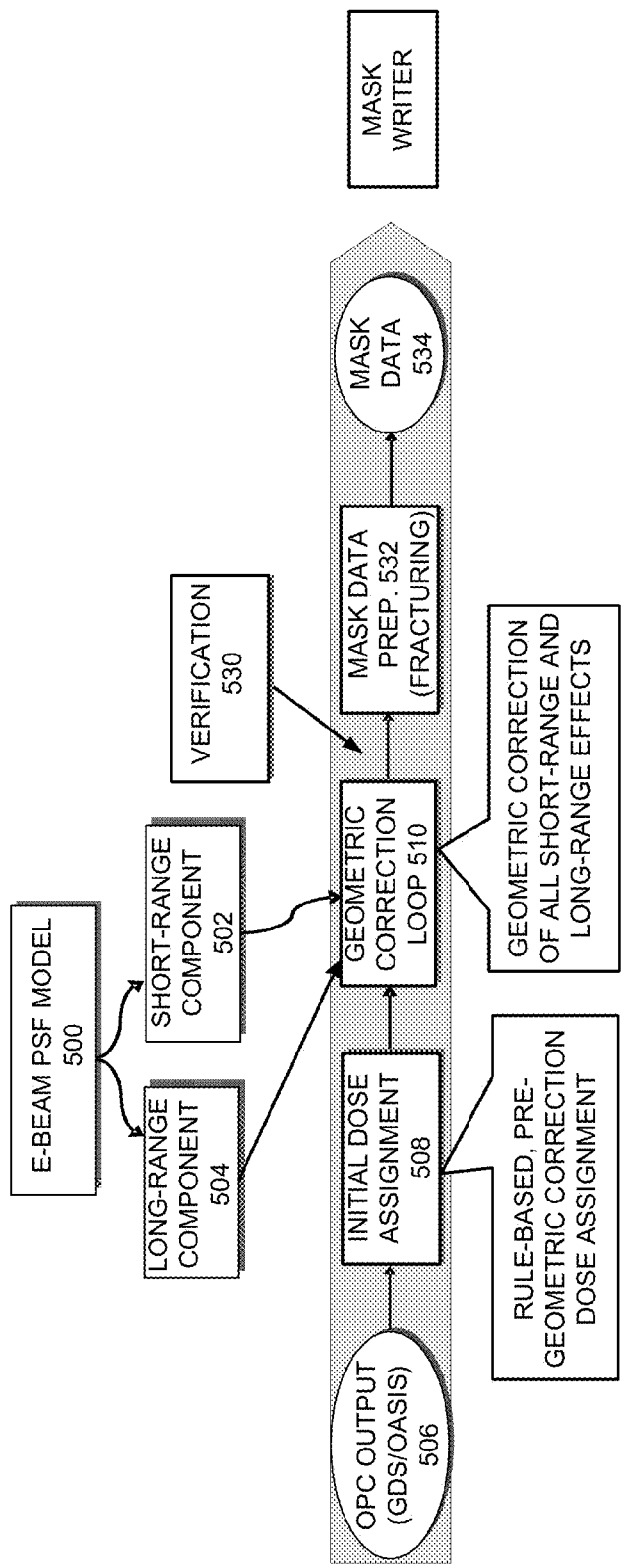
FIG. 5A illustrates a process flow of a geometry-based e-beam mask correction in accordance with some embodiments described herein.

FIG. 5A illustrates a process flow of a geometry-based e-beam mask correction in accordance with some embodiments described herein. As illustrated in FIG. 5A, the e-beam PSF model 500 is separated into a short-range component 502 which includes the short-range effect terms, and a long-range component 504 which includes the long-range effect terms. In one embodiment, short-range component 502 of the model and long-range component 504 of the model can be expressed in terms of the short-range PSF $f'(x, y)$ and the long-range PSF $f''(x, y)$, respectively.

The long-range component 504 of the model is then used to pre-compute a long-range resist intensity map on a post-OPC mask layout, i.e., OPC output 506. More specifically, prior to pre-computing the long-range resist intensity map, the system first performs a rule-based initial dose assignment 508 on the mask layout, i.e., OPC output 506. In one embodiment, performing the rule-based initial dose assignment involves converting the mask layout into a dose distribution. In a specific embodiment, a "center dose reduction" technique is employed to convert the mask layout into the said dose distribution. In this embodiment, a line pattern and edges of large patterns are assigned with full dose. Inside the large patterns and, in particular, in the center region of a large pattern, a reduced dose is assigned. In the area of the mask layout absent features, a zero dose may be assigned. The initial dose assignment can be performed based on a set of rules. They can be used to reduce mask writing time as well as heating and charging effects inside the resist. Note that in some embodiments initial dose assignment 508 is omitted.

After obtaining the dose distribution function $d''(x, y)$ (e.g., from the initial dose assignment 508 based on the mask layout), and the sampled long-range PSF $f''(x, y)$ over the coarse grid map, the long-range resist intensity map e"(x, y) can then be computed by convolving the two functions:

$$e''(x,y) = d''(x,y) \otimes f''(x,y). \quad (4)$$

Note that discrete convolutions can be efficiently computed using fast Fourier transform (FFT).

In practice, the computation of the long-range resist intensity map is typically performed on a coarse grid map. The grid sizes may be coarse because the long-range PSF $f''(x, y)$ has very low frequencies. The grid size can be determined by the bandwidth of the long-range PSF according to the Nyquist Sampling Theorem. The dose function d"(x, y) is sampled on the same grid with a properly chosen anti-aliasing filter. In one embodiment, a grid size of 1 µm or 2 µm may be sufficient for the sampling of the initial dose assignment on the mask layout and for the sampling of the long-range PSF. A grid size much less than 1 µm may be unnecessary.

The computed long-range resist intensity map e"(x, y) is comprised of intensity values computed on the grid points of the coarse grid map, wherein each grid point corresponds to a different location on the mask layout. Because the long-range resist intensity map e"(x, y) is mask-specific, it is typically recomputed for each new mask layout to be corrected. However, the coarse grid map used to compute long-range effects also makes the long-range resist intensity map e"(x, y) insensitive to the local geometric corrections (e.g., OPC corrections) made on small mask features. This is because the long-range resist intensity map e"(x, y) is generated based on the feature density value, which does not change with, or is insensitive to, small edge movements. Hence, the long-range resist intensity map e"(x, y) is only computed once during mask correction, and the values of the intensity map can be stored in a lookup table. This is important for correction turn-around-time (TAT) because the lookup table is not recalculated during the subsequent correction iterations, but stays fixed.

Figure 5B:
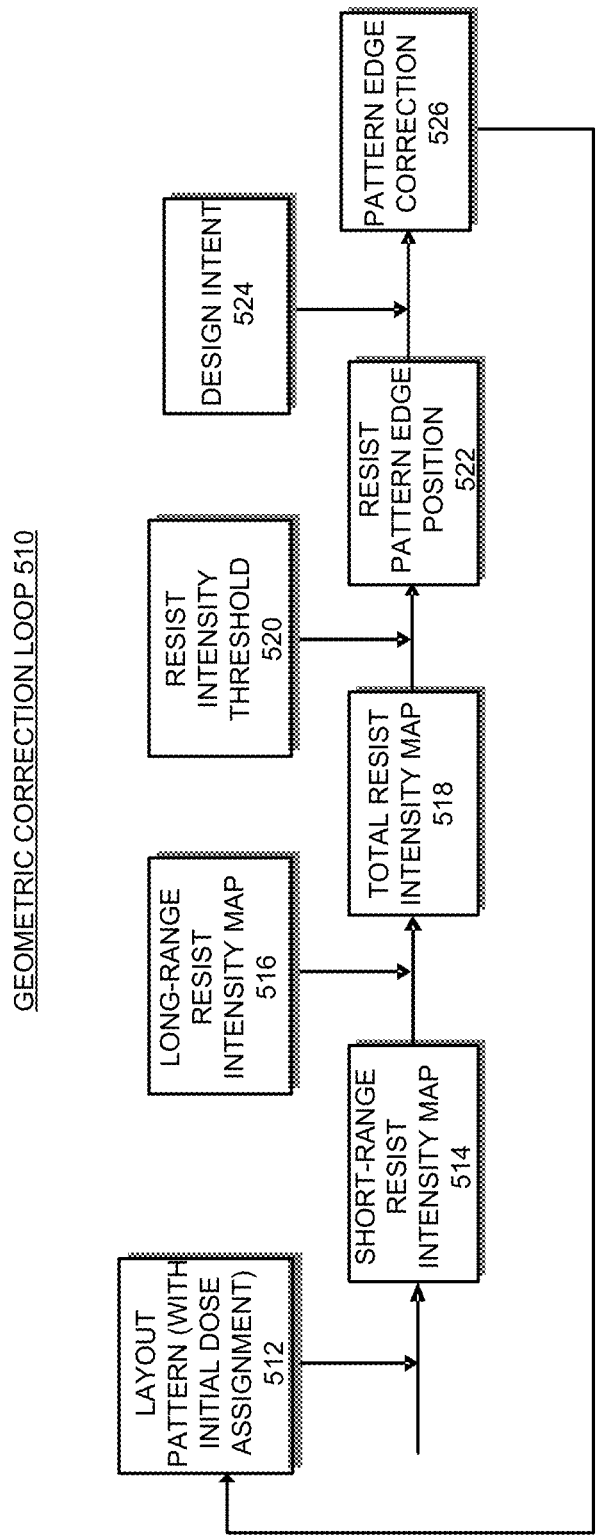
FIG. 5B illustrates a process flow of a geometric correction on a layout pattern in accordance with some embodiments described herein.

Referring back to FIG. 5A, note that the initial dose assignment 508, long-range resist intensity map (which was computed based on long-range component 504 of the model), and short-range component of the model 502 are then used during geometric correction loop 510. More specifically, FIG. 5B illustrates a process flow of geometric correction loop 510 on a layout pattern in accordance with some embodiments described herein. As shown in FIG. 5B, a short-range resist intensity map 514 is computed by convolving short-range PSF $f'(x, y)$ with a layout pattern (with initial dose assignment) 512 to be corrected, wherein layout pattern 512 may be significantly smaller than the full mask layout. In one embodiment, layout pattern 512 is a small portion of a large design pattern within the mask layout.

In one embodiment, prior to performing the convolution, layout pattern 512 is converted into a local dose distribution function d'(x, y) based on a local grid map which covers layout pattern 512. Short-range resist intensity map 514 (i.e., e'(x, y)) can then be computed by convolving the local dose distribution function d'(x, y) and the short-range PSF $f'(x, y)$:

$$e'(x,y) = d'(x,y) \otimes f'(x,y). \quad (5)$$

Note that the local grid map uses much smaller grid sizes than those used in the coarse grid map for pre-computing the long-range resist intensity map.

After obtaining short-range resist intensity map 514 (i.e., e'(x, y)), it is then combined with long-range resist intensity map 516 (i.e., e"(x, y)) which has been pre-computed and stored to obtain a total resist intensity map 518 or "e(x, y)":

$$e(x,y) = e'(x,y) + e''(x,y). \quad (6)$$

Note that total resist intensity map 518 now includes both the short-range effects and the long-range effects. Total resist intensity map 518 can then be used to perform resist pattern simulation and correction. More specifically, by applying a resist intensity threshold 520 on total resist intensity map 518, resist pattern edge position 522 can be determined. Resist pattern edge position 522 is then compared with design intent 524 which specifies the desired resist pattern edge position. If resist pattern edge position 522 and design intent 524 do not substantially match, a pattern edge correction 526 is generated and used to make adjustments to layout pattern 512. In such cases, short-range resist intensity map 514 is recomputed based on the corrected layout pattern 512, and the process flow illustrated in FIG. 5B is repeated. Geometric correction loop 510 is concluded when pattern edge correction 526 is smaller than a predetermined correction threshold.

Note that geometric correction loop 510 is used to correct for both short-range effects and long-range effects using only geometric corrections without having to do any dose adjustment. While geometric correction loop 510 is described in FIG. 5B to treat a single layout feature, the described correction process can be repeated for multiple layout patterns in need of correction, in sequence processing, in parallel processing, or by a combination of both. Referring back to FIG. 5A, note that the output of geometric correction loop 510 is an e-beam effect-corrected mask layout, which after verification 530, is subsequently fractured during mask data preparation 532 to generate the e-beam effect-corrected mask data 534.

Figure 6:
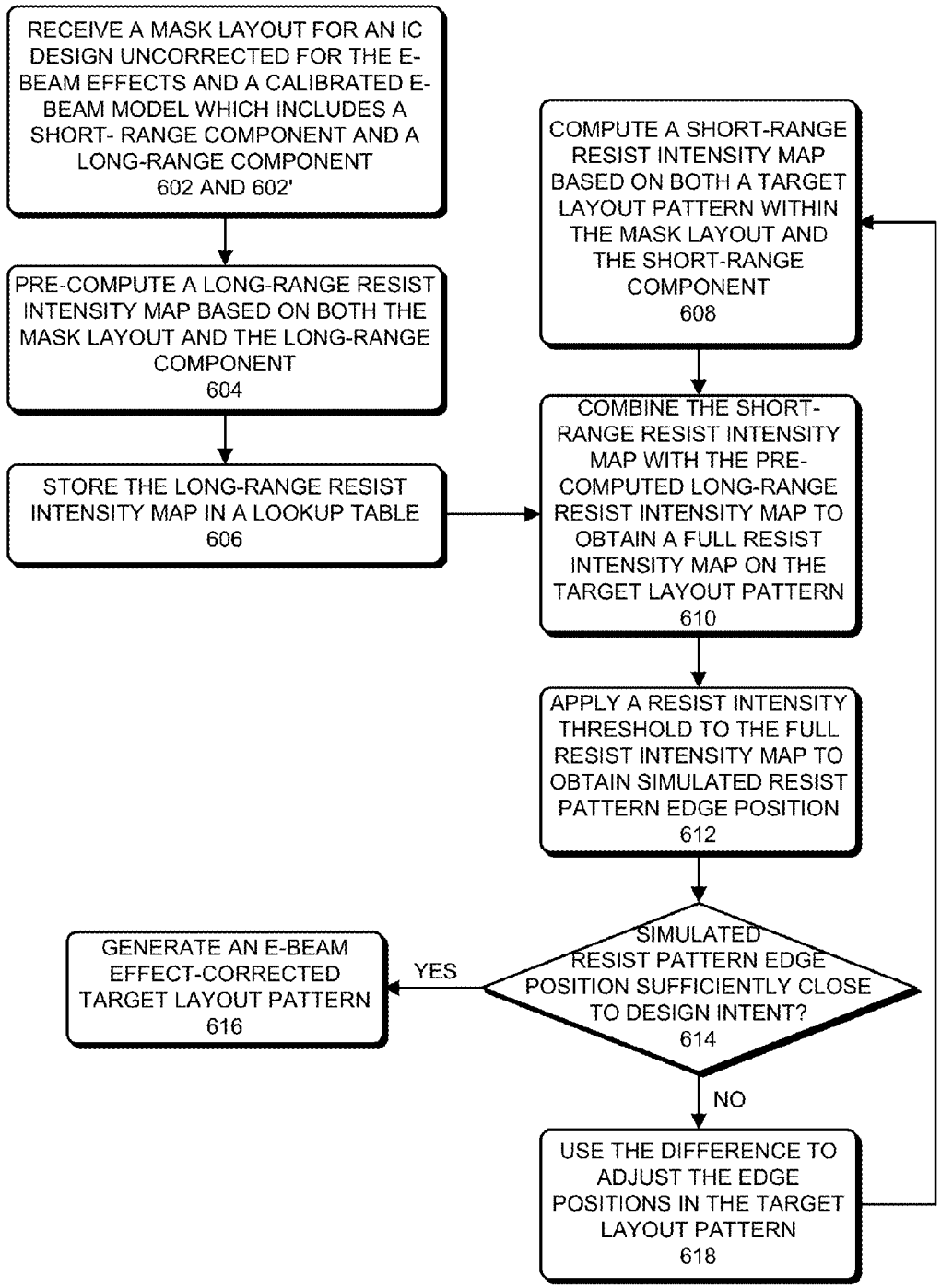
FIG. 6 presents a flowchart illustrating a process of performing a geometry-based e-beam mask correction in accordance with some embodiments described herein.

FIG. 6 presents a flowchart illustrating a process of performing a geometry-based e-beam mask correction in accordance with some embodiments described herein. As illustrated in FIG. 6, the process may begin by receiving a mask layout for an integrated circuit (IC) design uncorrected for the e-beam effects, and a calibrated e-beam model which includes a short-range component (that models the short-range effects) and a long-range component (that models the long-range effects) (step 602). In one embodiment, the mask layout is a post-OPC mask layout.

The system then pre-computes a long-range resist intensity map based on both the mask layout and the long-range component of the model (step 604). In one embodiment, the system generates a dose distribution function based on the mask layout, and then convolves the dose distribution function with the long-range PSF of the long-range component of the model to obtain the long-range resist intensity map. In one embodiment, the long-range resist intensity map is computed at grid points of a coarse grid map applied over the mask layout.

Next, the system stores the long-range resist intensity map in a lookup table so that the values of the intensity map can be later retrieved and reused (step 606).

After pre-computing the long-range effects, the system begins mask layout corrections by computing a short-range resist intensity map based on both a target layout pattern within the mask layout and the short-range component of the model (step 608). In one embodiment, the system computes the short-range resist intensity map by convolving a short-range PSF of the short-range component of the model with the target layout pattern to be corrected. In one embodiment, the short-range resist intensity map is computed at grid points of a fine grid map applied over the target layout pattern, wherein the grid size of the fine grid map is significantly smaller than the grid size of the coarse grid map associated with the long-range component of the model.

Next, the system combines the short-range resist intensity map with the pre-computed long-range resist intensity map to obtain a full resist intensity map on the target layout pattern (step 610). Note that the full resist intensity map includes both the short-range and long-range effects from the e-beam model. The system subsequently applies a resist intensity threshold to the full resist intensity map to obtain a simulated resist pattern edge position (step 612). Next, the system compares the simulated resist pattern edge position with the design intent for the target layout pattern to determine if they are substantially matched (step 614). In one embodiment, the system determines that the simulated resist pattern edge position and the design intent are substantially matched if the difference is less than a threshold value. If the simulated resist pattern edge position is determined to match the design intent, the system generates an e-beam effect-corrected target layout pattern (step 616). Otherwise, the system uses the computed difference to adjust the edge positions in the target layout pattern (step 618) and returns to step 608 to repeat the calibration steps. For the full mask layout correction, steps 608-618 are repeated for all target layout patterns within the mask layout. For a partial mask layout correction, steps 608-618 are repeated for a selected number of target layout patterns within the mask layout. The corrections for the individual target layout patterns can be performed in sequence, in parallel, or a combination of both.

Note that while the above discussion is directed to a mask layout, the process described above is readily applicable to correcting a reticle.

Figure 7:
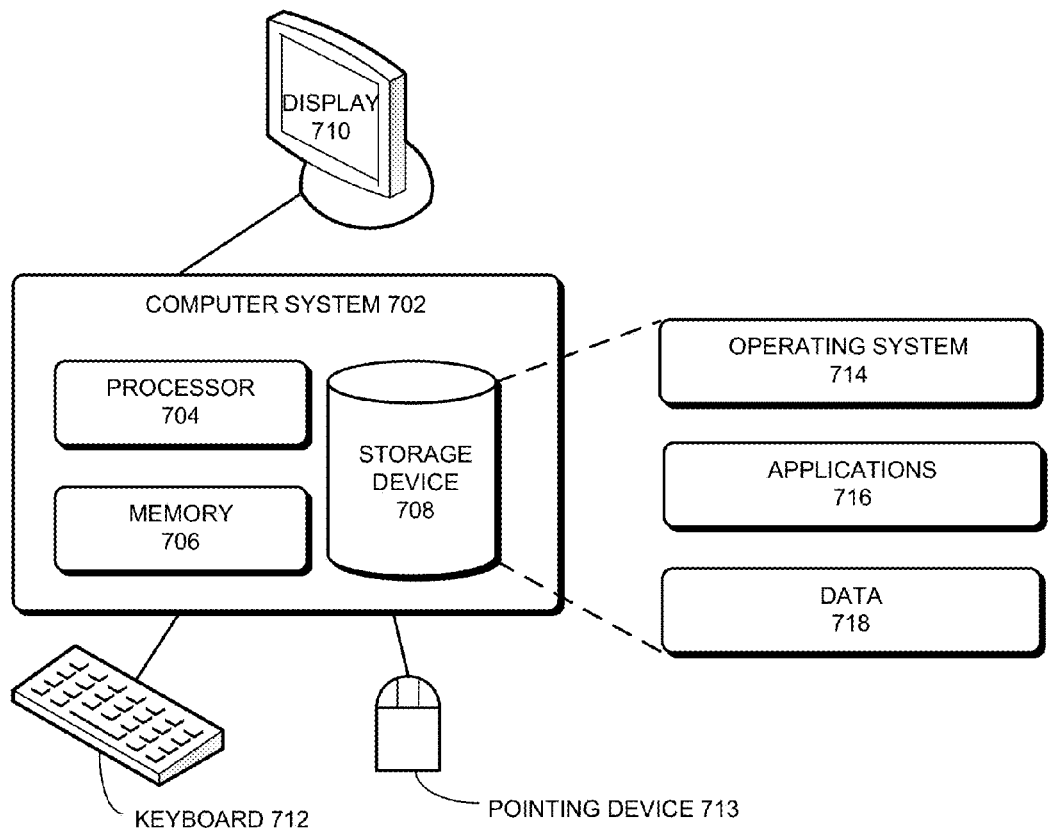
FIG. 7 illustrates a computer system in accordance with some embodiments described herein.

FIG. 7 illustrates a computer system in accordance with some embodiments described herein.

Computer system 702 includes a processor 704, a memory 706, and a storage device 708. Furthermore, computer system 702 can be coupled to a display device 710, a keyboard 712, and a pointing device 713. Storage device 708 can store operating system 714, applications 716, and data 718.

Applications 716 can include instructions which, when executed by computer system 702, can cause computer system 702 to perform methods and/or processes that are explicitly or implicitly described in this disclosure. Data 718 can include any data that is required as input or that is generated as output by the methods and/or processes described in this disclosure.

Figure 8:
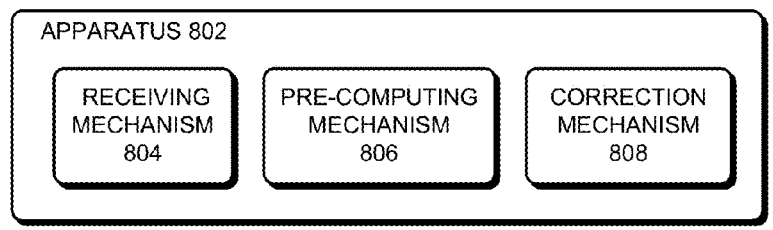
FIG. 8 illustrates an apparatus in accordance with some embodiments described herein.

FIG. 8 illustrates an apparatus in accordance with some embodiments described herein.

Apparatus 802 can comprise a plurality of mechanisms which may communicate with one another via a wired or wireless communication channel. Apparatus 802 may be realized using one or more integrated circuits, and apparatus 802 may include fewer or more mechanisms than those shown in FIG. 8. Further, apparatus 802 may be integrated in a computer system, or it may be realized as a separate device which is capable of communicating with other computer systems and/or devices.

Specifically, apparatus 802 can include receiving mechanism 804, pre-computing mechanism 806, and correction mechanism 808. Receiving mechanism 804 can be configured to receive an e-beam model or a mask layout for an IC design, or perform any other tasks related to these tasks as disclosed in this disclosure. Pre-computing mechanism 806 can be configured to compute a first resist intensity map based at least on the long-range component of the e-beam model and the mask layout, or perform any other tasks related to these tasks as disclosed in this disclosure. Correction mechanism 808 can be configured to iteratively correct a target pattern within the mask layout by (1) computing a second resist intensity map on the target pattern based at least on the short-range component of the e-beam model and the target pattern; (2) obtaining a combined resist intensity map on the target pattern by combining the first resist intensity map and the second resist intensity map; and (3) adjusting the target pattern based at least on the combined resist intensity map and the design intent, or perform any other tasks related to these tasks as disclosed in this disclosure.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) software tool in a computer, a method for correcting a mask layout to compensate for electron-beam (e-beam) proximity effects during e-beam lithography, the method comprising:
   receiving a calibrated e-beam model which includes a long-range component which models long-range electron effects and a short-range component which models short-range electron effects;
   receiving a mask layout to be corrected, wherein the mask layout is generated based on a design intent;
   the EDA software tool in the computer pre-computing a first resist intensity map based on the long-range component of the calibrated e-beam model and the mask layout; and
   the EDA software tool in the computer correcting a target pattern within the mask layout by, iteratively:
   computing a second resist intensity map on the target pattern based on the short-range component of the calibrated e-beam model and the target pattern;
   obtaining a combined resist intensity map on the target pattern by combining the first resist intensity map and the second resist intensity map; and
   adjusting the target pattern based on the combined resist intensity map and the design intent.

2. The method of claim 1, wherein pre-computing the first resist intensity map based on the long-range component of the calibrated e-beam model and the mask layout involves:
   receiving a grid map for the mask layout; creating a dose distribution function over the grid map based on the mask layout; and
   convolving the long-range component of the calibrated e-beam model with the dose distribution function over the grid map to obtain the first resist intensity map.

3. The method of claim 2, wherein creating the dose distribution function involves assigning a dose value based at least on pattern size and a set of rules.

4. The method of claim 2, wherein the method further comprises storing the first resist intensity map in a lookup table.

5. The method of claim 4, wherein obtaining the combined resist intensity map on the target pattern involves:
   retrieving, from the lookup table, one or more values of the first resist intensity map within a portion of the grid map that covers the target pattern; and combining the one or more values of the first resist intensity map with the second resist intensity map.

6. The method of claim 1, wherein computing the second resist intensity map based on the short-range component of the calibrated e-beam model and the target pattern involves:
creating a local dose distribution function on a local grid map associated with the target pattern; and
convolving the short-range component of the calibrated e-beam model with the local dose distribution function to obtain the second resist intensity map for the target patterns.

7. The method of claim 1, wherein adjusting the target pattern based on the combined resist intensity map and the design intent involves:
applying a resist intensity threshold to the combined resist intensity map to obtain a simulated resist pattern edge position;
comparing the simulated resist pattern edge position with the design intent for the target pattern to determine if the simulated resist pattern edge position substantially matches the design intent; and
if not, adjusting the target pattern based on a difference between the simulated resist pattern edge position and the design intent.

8. The method of claim 7, wherein adjusting the target pattern involves adjusting a geometric feature on the target pattern.

9. The method of claim 1, wherein the method further comprises correcting multiple target patterns on the mask layout.

10. The method of claim 1, wherein the method further comprises performing mask data preparation on the mask layout after the mask layout has been corrected for the e-beam proximity effects.

11. A non-transitory computer-readable storage medium storing instructions that when executed by a computer cause the computer to perform a method for correcting a mask layout to compensate for electron-beam (e-beam) proximity effects during e-beam lithography, the method comprising:
receiving a calibrated e-beam model which includes a long-range component which models long-range electron effects and a short-range component which models short-range electron effects;
receiving a mask layout to be corrected, wherein the mask layout is generated based on a design intent;
pre-computing a first resist intensity map based on the long-range component of the calibrated e-beam model and the mask layout; and
correcting a target pattern within the mask layout by, iteratively:
computing a second resist intensity map on the target pattern based on the short-range component of the calibrated e-beam model and the target pattern;
obtaining a combined resist intensity map on the target pattern by combining the first resist intensity map and the second resist intensity map; and
adjusting the target pattern based on the combined resist intensity map and the design intent.

12. The non-transitory computer-readable storage medium of claim 11, wherein pre-computing the first resist intensity map based on the long-range component of the calibrated e-beam model and the mask layout involves:
receiving a grid map for the mask layout;
creating a dose distribution function over the grid map based on the mask layout; and
convolving the long-range component of the calibrated e-beam model with the dose distribution function over the grid map to obtain the first resist intensity map.

13. The non-transitory computer-readable storage medium of claim 12, wherein creating the dose distribution function involves assigning a dose value based at least on pattern size and a set of rules.

14. The non-transitory computer-readable storage medium of claim 12, wherein the method further comprises storing the first resist intensity map in a lookup table.

15. The non-transitory computer-readable storage medium of claim 14, wherein obtaining the combined resist intensity map on the target pattern involves:
retrieving, from the lookup table, one or more values of the first resist intensity map within a portion of the grid map that covers the target pattern; and
combining the one or more values of the first resist intensity map with the second resist intensity map.

16. The non-transitory computer-readable storage medium of claim 11, wherein computing the second resist intensity map based on the short-range component of the calibrated e-beam model and the target pattern involves:
creating a local dose distribution function on a local grid map associated with the target pattern; and
convolving the short-range component of the calibrated e-beam model with the local dose distribution function to obtain the second resist intensity map for the target patterns.

17. The non-transitory computer-readable storage medium of claim 11, wherein adjusting the target pattern based on the combined resist intensity map and the design intent involves:
applying a resist intensity threshold to the combined resist intensity map to obtain a simulated resist pattern edge position;
comparing the simulated resist pattern edge position with the design intent for the target pattern to determine if the simulated resist pattern edge position substantially matches the design intent; and
if not, adjusting the target pattern based on a difference between the simulated resist pattern edge position and the design intent.

18. The non-transitory computer-readable storage medium of claim 17, wherein adjusting the target pattern involves adjusting a geometric feature on the target pattern.

19. The non-transitory computer-readable storage medium of claim 11, wherein the method further comprises correcting multiple target patterns on the mask layout.

20. The non-transitory computer-readable storage medium of claim 11, wherein the method further comprises performing mask data preparation on the mask layout after the mask layout has been corrected for the e-beam proximity effects.

21. In an electronic design automation (EDA) software tool in a computer, a method for modeling electron-beam (e-beam) proximity effects using an e-beam lithography model, the method comprising:
receiving an uncalibrated e-beam model which includes a long-range component which models long-range electron effects and a short-range component which models short-range electron effects, and a set of model parameters to be calibrated;
receiving a test pattern for calibrating the uncalibrated e-beam model;

the EDA software tool in the computer pre-computing a first intensity map based on the long-range component of the uncalibrated e-beam model and the test layout; and the EDA software tool in the computer iteratively calibrating the uncalibrated e-beam model by:
   computing a second intensity map based on the short-range component of the uncalibrated e-beam model and the test pattern;
   obtaining a combined resist intensity map on the target pattern by combining the first resist intensity map and the second resist intensity map; and
   adjusting the set of model parameters associated with the uncalibrated e-beam model based on the combined intensity map and the test pattern.

22. The method of claim 21, wherein adjusting the set of model parameters associated with the uncalibrated e-beam model based on the combined intensity map and the test pattern involves:
   applying a resist intensity threshold on the combined resist intensity map to obtain one or more simulated critical dimensions (CDs); and
   optimizing the set of model parameters to minimize the differences between the simulated CDs and corresponding measured CDs obtained from the fabricated test pattern on a wafer.

23. A non-transitory computer-readable storage medium storing instructions that when executed by a computer cause the computer to perform a method for modeling electron-beam (e-beam) proximity effects using an e-beam lithography model, the method comprising:
   receiving an uncalibrated e-beam model which includes a long-range component which models long-range electron effects and a short-range component which models short-range electron effects, and a set of model parameters to be calibrated;
   receiving a test pattern for calibrating the uncalibrated e-beam model;
   pre-computing a first intensity map based on the long-range component of the uncalibrated e-beam model and the test layout; and
   iteratively calibrating the uncalibrated e-beam model by:
      computing a second intensity map based on the short-range component of the uncalibrated e-beam model and the test pattern;
      obtaining a combined resist intensity map on the target pattern by combining the first resist intensity map and the second resist intensity map; and
      adjusting the set of model parameters associated with the uncalibrated e-beam model based on the combined intensity map and the test pattern.

24. The non-transitory computer-readable storage medium of claim 23, wherein adjusting the set of model parameters associated with the uncalibrated e-beam model based on the combined intensity map and the test pattern involves:
   applying a resist intensity threshold on the combined resist intensity map to obtain one or more simulated critical dimensions (CDs); and
   optimizing the set of model parameters to minimize the differences between the simulated CDs and corresponding measured CDs obtained from the fabricated test pattern on a wafer.

\* \* \* \* \*